(12) United States Patent
Takaki et al.

(10) Patent No.: US 6,279,504 B1
(45) Date of Patent: Aug. 28, 2001

(54) PLASMA CVD SYSTEM

(75) Inventors: Satoshi Takaki, Komae; Koji Teranishi, Yokohama, both of (JP)

(73) Assignee: Canon Kabushiki Kaisha

( * ) Notice: Subject to any disclaimer, the term of this patent is extended or adjusted under 35 U.S.C. 154(b) by 0 days.

(21) Appl. No.: 09/204,504

(22) Filed: Dec. 4, 1998

(30) Foreign Application Priority Data

Dec. 10, 1997 (JP) .................................................... 9-361833
Dec. 27, 1997 (JP) .................................................... 9-367729
Nov. 20, 1998 (JP) .................................................. 10-347797

(51) Int. Cl.[7] .............................. C23C 16/00; H05H 1/00
(52) U.S. Cl. ................................. 118/723 E; 118/723 R; 156/345
(58) Field of Search ........................... 118/723 E, 723 R, 118/715, 728, 729, 730, 718; 156/345

(56) References Cited

U.S. PATENT DOCUMENTS

| 5,534,070 | * | 7/1996 | Okamura et al. | ................ | 118/723 E |
| 5,540,781 |   | 7/1996 | Yamagami et al. | .............. | 118/723 E |
| 5,558,719 | * | 9/1996 | Tsudicha et al. | ................ | 118/723 E |
| 6,076,481 | * | 6/2000 | Yamagami et al. | .............. | 118/723 E |

OTHER PUBLICATIONS

H. Curtins et al., Influence of Plasma Excitation Frequency for α–Si:H Thin Film Deposition, 7 Plasma Chem. & Plasma Proc. 267, 267–73 (1987).

* cited by examiner

*Primary Examiner*—Gregory Mills
*Assistant Examiner*—P. Hassanzadeh
(74) *Attorney, Agent, or Firm*—Fitzpatrick, Cella, Harper & Scinto

(57) ABSTRACT

A plasma CVD system has a reactor which can be evacuated, a substrate holding means in the reactor, a material gas feed means for feeding into the reactor a material gas for plasma CVD, a high-frequency power supply means for supplying an electrode high-frequency power of 30 MHz to 600 MHz, generated by a high-frequency power source, and means for exhausting gas remaining in the reactor after the reaction. The high-frequency power is supplied to produce a plasma across a substrate in the reactor to form a deposited film on the substrate, and the phase of reflected power is adjusted on the electrode at a side opposite the feeding point. High-quality deposited films having very uniform film thickness and homogeneous film quality can be formed at a high rate and stably on large-area substrates having any shapes.

15 Claims, 9 Drawing Sheets

PLASMA CVD SYSTEM

BACKGROUND OF THE INVENTION

1. Field of the Invention

This invention relates to a plasma CVD (chemical vapor deposition) process and a plasma CVD system which make use of high-frequency power and are usable in the manufacture of semiconductor devices, electrophotographic photosensitive member devices, image-inputting line sensors, flat-panel display devices, image pickup devices, photovoltaic devices and so forth.

2. Related Background Art

In recent years, in the process of producing semiconductor devices and the like, plasma CVD systems and plasma CVD processes have been put into practical use in an industrial scale. In particular, plasma CVD systems making use of a high-frequency power of 13.56 MHz are in wide use because processing can be carried out regardless of whether substrate materials and deposited-film materials are conductors or insulators.

As an example of conventional plasma-producing high-frequency electrodes and plasma CVD systems and processes making use of such electrodes, a parallel-plate type system will be described with reference to FIG. 1. In a reactor 101, a high-frequency electrode 103 is provided via an insulating high-frequency electrode support base 102.

The high-frequency electrode 103 is a flat plate provided in parallel to an opposing electrode 105, and plasma is caused to take place by the aid of an electric field determined by electrostatic capacitance exhibited between the electrodes. Once plasma has taken place, a plasma region which is substantially a conductor and a sheath which acts chiefly as a capacitor in an equivalent manner between the plasma and the both electrodes or reactor wall are formed between the electrodes to provide an impedance greatly different from that before the plasma takes place.

Around the high-frequency electrode 103, an earth shield 104 is provided so that any discharge may not occur between the side of the high-frequency electrode 103 and the wall of the reactor 101. To the high-frequency electrode 103, a high-frequency power source 111 is connected through a high-frequency power supply wire 110.

A flat-plate film-forming substrate 106 on which plasma CVD is carried out is attached to the opposing electrode 105 provided in parallel to the high-frequency electrode 103, and the substrate 106 to be processed is kept at a desired temperature by a substrate temperature control means (not shown).

Plasma CVD using this system is carried out in the following way. After the inside of the reactor 101 is evacuated to a high vacuum by an evacuation means 107, reaction gases are fed into the reactor 101 through a gas feed means 108, and its inside is kept at a predetermined pressure. A high-frequency power is supplied from the high-frequency power source 111 to the high-frequency electrode 103 to cause a plasma to take place across the high-frequency electrode and the opposing electrode.

Thus, the reaction gases are decomposed and excited by plasma to form a deposited film on the film-forming substrate 106. As the high-frequency power, it is common to use a high-frequency power of 13.56 MHz. Use of such a discharge frequency of 13.56 MHz makes it relatively easy to control discharge conditions and brings about an advantage that the film formed can have a good film quality, but may result in a low gas utilization efficiency and a relatively small deposited-film formation rate.

Taking account of these points, studies are made on plasma CVD carried out at a high-frequency power having a frequency of about 25 to 150 MHz. For example, Plasma Chemistry and Plasma Processing, Vol. 7, No. 3, 1987, pp.267–273 (hereinafter "publication 1") discloses that a material gas (silane gas) is decomposed by a high-frequency power having a frequency of about 25 to 150 MHz, using a parallel-plate type glow discharge decomposition system.

Stated specifically, the publication 1 discloses that, in the formation of a-Si films at frequencies changed within the range of from 25 MHz to 150 MHz, film deposition rate reaches a maximum of 2.1 nm/sec when 70 MHz is used, and this is a formation rate about 5 to 8 times that in the plasma CVD carried out at 13.56 MHz, and that a-Si film defect density, optical band gap and conductivity are not so much affected by excitation frequencies.

The publication 1 shows an example of a plasma CVD system suited for the processing of flat substrates of a laboratory scale. As for an example of a plasma CVD system suited for the formation of deposited films on film-forming substrates of a large industrial scale (e.g., cylindrical substrates), it is disclosed in, e.g., U.S. Pat. No. 5,540,781 (hereinafter "publication 2").

This publication 2 discloses a plasma CVD process and a plasma CVD system which make use of a high-frequency power of what is called VHF band, having a frequency of from 60 MHz to 300 MHz. The plasma CVD system as disclosed in the publication 2 will be described with reference to FIG. 2.

The plasma CVD system shown in FIG. 2 is the VHF plasma CVD system disclosed in the publication 2.

In FIG. 2, reference numeral 200 denotes a reactor. The reactor 200 has a base plate 201, insulating members 202A, cathode electrodes 203C, insulating members 221B, cathode electrodes 203B, insulating members 221A, cathode electrodes 203A, insulating members 202B and a top cover 215.

Reference numeral 205A denotes a substrate holder, which has a heater column 205A' inside. Reference numeral 205A" denotes a substrate heater attached to the heater column 205A'. Reference numeral 206 denotes a cylindrical film-forming substrate provided on the substrate holder 205A. Reference numeral 205B denotes an auxiliary holding member for the cylindrical film-forming substrate 206. The substrate holder 205A has at its bottom a rotating mechanism (not shown) connected to a motor and is so designed as to be optionally rotatable. Reference numeral 207 denotes an exhaust pipe having an exhaust valve, and the exhaust pipe communicates with an exhaust mechanism 207' having a vacuum pump. Reference numeral 208 denotes a material gas feed assemblage constituted of gas cylinders, mass-flow controllers, valves and so forth. The material gas feed assemblage 208 is connected to gas release pipes 216 having a plurality of gas release holes, through a gas feed pipe 217. Material gases are fed into the reactor through the plurality of gas release holes of the gas release pipes 216. Reference numeral 211 denotes a high-frequency power source, and a high-frequency power generated here is supplied to the cathode electrodes 203 (203A to 203C) through a high-frequency power supply wire 218 and matching circuits 209 (209A to 209C). In the plasma CVD system shown in FIG. 2, the cathode electrodes are so constituted as to be divided electrically into three electrodes 203A, 203B and 203C in the axial direction of the cylindrical film-forming substrate. The high-frequency power generated in the high-frequency power source 211 is divided into three parts by a high-frequency power dividing means (distributor) 220, and then supplied to the cathode electrodes 203A, 203B and 203C through matching circuits 209A, 209B and 209C, respectively.

The publication 2 also describes a plasma CVD process carried out using the plasma CVD system shown in FIG. 2.

That is, in the system shown in FIG. 2, the cylindrical film-forming substrate 206 is set to the substrate holder 205, and thereafter the inside of the reactor 200 is evacuated by the operation of the exhaust mechanism 207' to evacuate the inside of the reactor to have a predetermined pressure. Then, the heater 205A" is electrified to heat the substrate 206 so as to be kept at a desired temperature.

Next, material gases are fed into the reactor 200 from the material gas feed assemblage 208 through the gas feed pipe 217 and gas release pipes 216, and the inside of the reactor is adjusted to a desired pressure. In this state, a high-frequency power having a frequency in the range of from 60 MHz to 300 MHz is generated by the high-frequency power source 211. The high-frequency power is divided into three parts in the high-frequency power distributor 220, and then supplied to the cathode electrodes 203A, 203B and 203C through the matching circuits 209A, 209B and 209C, respectively. Thus, in the space defined by the cylindrical film-forming substrate 206 and the cathode electrodes, the material gases are decomposed by high-frequency energy to produce active species, so that a deposited film is formed on the cylindrical film-forming substrate 206.

The publication 2 states that, since the cylindrical cathode electrode is divided in the plasma CVD system making use of the high-frequency power having a frequency in the range of from 60 MHz to 300 MHz as stated above, a highly uniform deposited film can be formed on a large-area cylindrical film-forming substrate while maintaining the high film deposition rate that is an advantage of the VHF region high-frequency plasma CVD.

However, the film formation using the high-frequency power having a frequency of from 25 to 150 MHz in the parallel-plate type system disclosed in the publication 1 is carrie out in a laboratory scale, and also the publication does not refer at all to whether or not such an effect can be expected in the formation of large-area films. In general, the higher the excitation frequency is, the more remarkable the influence of standing waves produced on a high-frequency electrode is, where, especially on flat electrodes, two-dimensional complicated standing waves may occur. Hence, it is foreseen that it will be difficult to form large-area films uniformly.

In the plasma CVD process and plasma CVD system disclosed in the prior art publication 2, it can be expected that deposited films are formed at a high deposition rate and in a high uniformity when large-area deposited films are formed in a cylindrical form. However, it is foreseen that a plurality of feeding points will be required on one cathode to make the system complicated and also that it will be difficult to make adaptation to flat substrates.

SUMMARY OF THE INVENTION

Objects of the present invention are to solve the problems the prior art has had, and to provide a plasma CVD process and a plasma CVD system by which high-quality deposited films having a very uniform film thickness and a homogeneous film quality can be formed at a high rate and stably on large-area substrates having any shapes, to obtain semiconductor devices in a good efficiency.

The present invention provides a plasma CVD system comprising a reactor the inside of which can be evacuated, a substrate holding means provided in the reactor, a material gas feed means for feeding into the reactor a material gas for plasma CVD, a high-frequency power supply means for supplying to a plasma-producing high-frequency electrode a high-frequency power having an oscillation frequency in the range of from 30 MHz to 600 MHz, generated by a high-frequency power source, and an exhaust means for exhausting a gas remaining in the reactor after the reaction; the high-frequency power generated in the high-frequency power source being supplied to the plasma-producing high-frequency electrode to cause a plasma to take place across a substrate held by the substrate holding means and the plasma-producing high-frequency electrode to form a deposited film on the substrate; wherein, a phase-adjusting circuit for adjusting the phase of reflected power is connected to the plasma-producing high-frequency electrode at its end portion on the opposite side of a feeding point at which the high-frequency power is supplied to the plasma-producing high-frequency electrode.

The present invention also provides a plasma CVD process comprising the steps of feeding a material gas for film formation into a reactor the inside of which is kept evacuated, and decomposing the material gas into plasma by the aid of a high-frequency power having a frequency in the range of from 30 MHz to 600 MHz, to form a deposited film on a substrate provided inside the reactor, wherein;

a plurality of rod-like or plate-like conductive plasma-producing high-frequency electrodes are used to produce plasma by the aid of the high-frequency power, and the phase of reflected power is adjusted at a part of each plasma-producing high-frequency electrode on the opposite side of its feeding point, to produce a plasma.

DESCRIPTION OF THE PREFERRED EMBODIMENTS

Figure 1:
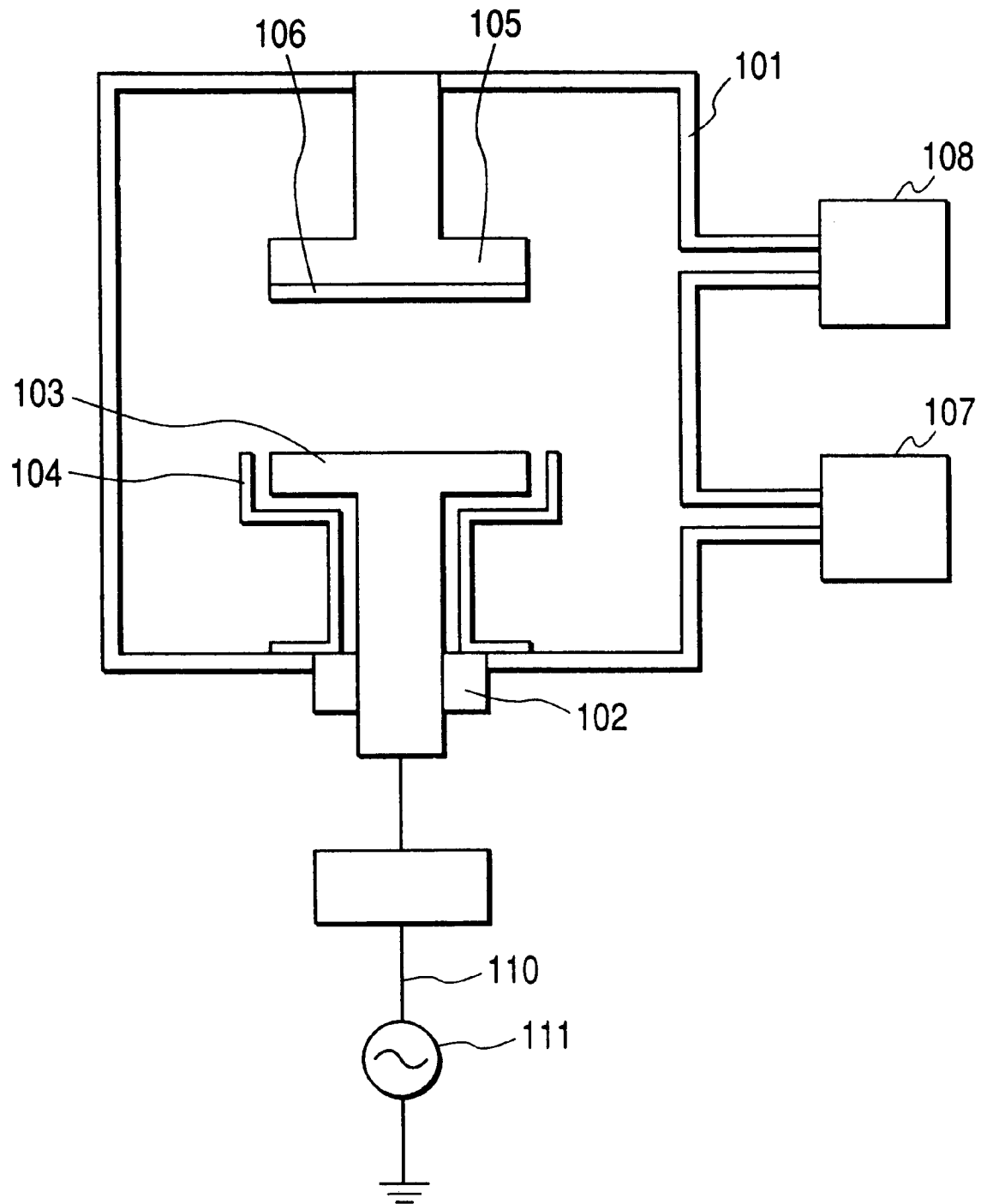
FIG. 1 is a diagrammatic cross-sectional view showing an example of a plasma CVD system having parallel-plate electrodes.
Figure 2:
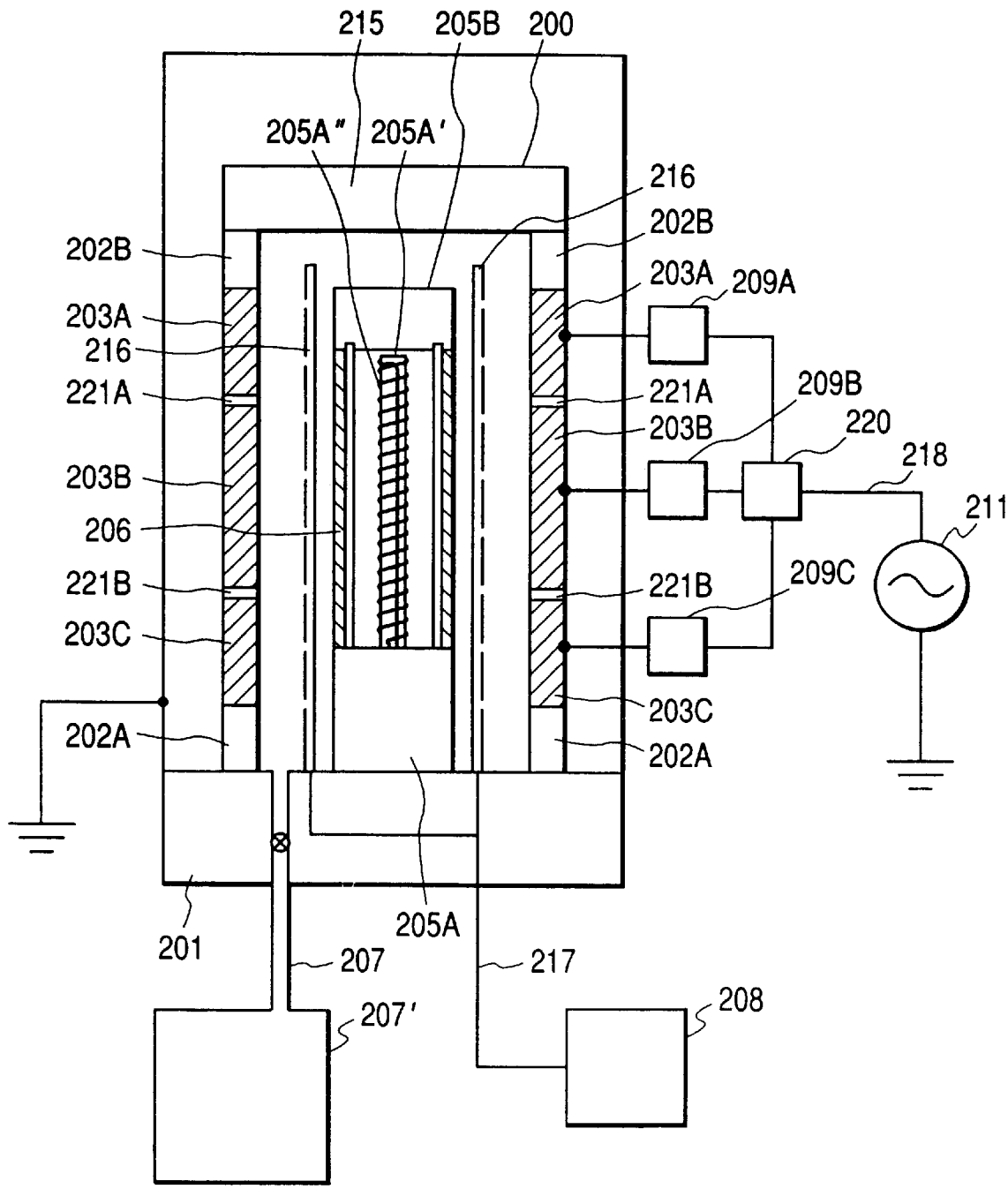
FIG. 2 is a diagrammatic cross-sectional view showing an example of a plasma CVD system which can form a deposited film on a cylindrical substrate.

In the present invention, the phase of reflected power on the opposite side of the feeding point of a high-frequency electrode is adjusted so that the above objects of the present invention can be achieved. This is based on the following results of studies made by the present inventors.

As a result of extensive studies, the present inventors have reached a finding that setting the high-frequency power to a frequency of 30 MHz or above enables discharge to take place in a high-vacuum region that may hardly cause polymerization reaction in the gaseous phase, can achieve always superior film properties and brings about an improvement also in deposition rate compared with the case of 13.56 MHz, but there is still a problem in the stability of discharge in the high-vacuum region and may result in poor distribution of film quality and deposition rate.

Accordingly, the present inventors further made extensive studies to elucidate the reason why the film quality lowers locally and deposition rate decreases when the high-frequency power is set to a frequency of 30 MHz or above. As the result, it has been found that there is a strong correlation between plasma potential and the local lowering of film quality and also a strong correlation between electron density in plasma and the deposition rate. More specifically, as a result of measurement of plasma potential in the axial direction of a cylindrical film-forming substrate by the Langmuir probe method, a decrease in plasma potential was seen at the part corresponding to the position where the film quality lowered locally.

From these results of studies, it is presumed that the poor distribution of film quality and deposition rate is caused by standing waves produced on the high-frequency electrode and by attenuation of high-frequency power on the high-frequency electrode. In general, when a high-frequency power is applied across a high-frequency electrode and an opposing electrode to produce plasma, unnegligible standing waves may be produced on the electrodes because of the relationship between the frequency of high-frequency power applied to the electrodes and the size of the electrodes. More specifically, standing waves tend to be produced when the high-frequency power has a high frequency or when the high-frequency electrode has a large area. If the standing waves are great, the electric field distribution in the high-frequency electrode may become poor to disturb plasma distribution such as plasma density, plasma potential and electron temperature between the electrodes to adversely affect the quality of films formed by plasma CVD. In the experiment mentioned above, it is considered that reflected waves have been produced on the high-frequency electrode at an end of the high-frequency electrode and their interference with incident waves has caused the standing waves that may affect film quality and deposition rate at a frequency of 30 MHz or above. In particular, it is considered that the electric field is so weak at the position of nodes of standing waves as to cause a decrease in local plasma potential to lower film quality locally.

The present invention has been accomplished on the basis of the above results of studies. The present invention will be described below with reference to the accompanying drawings.

Figure 3A:
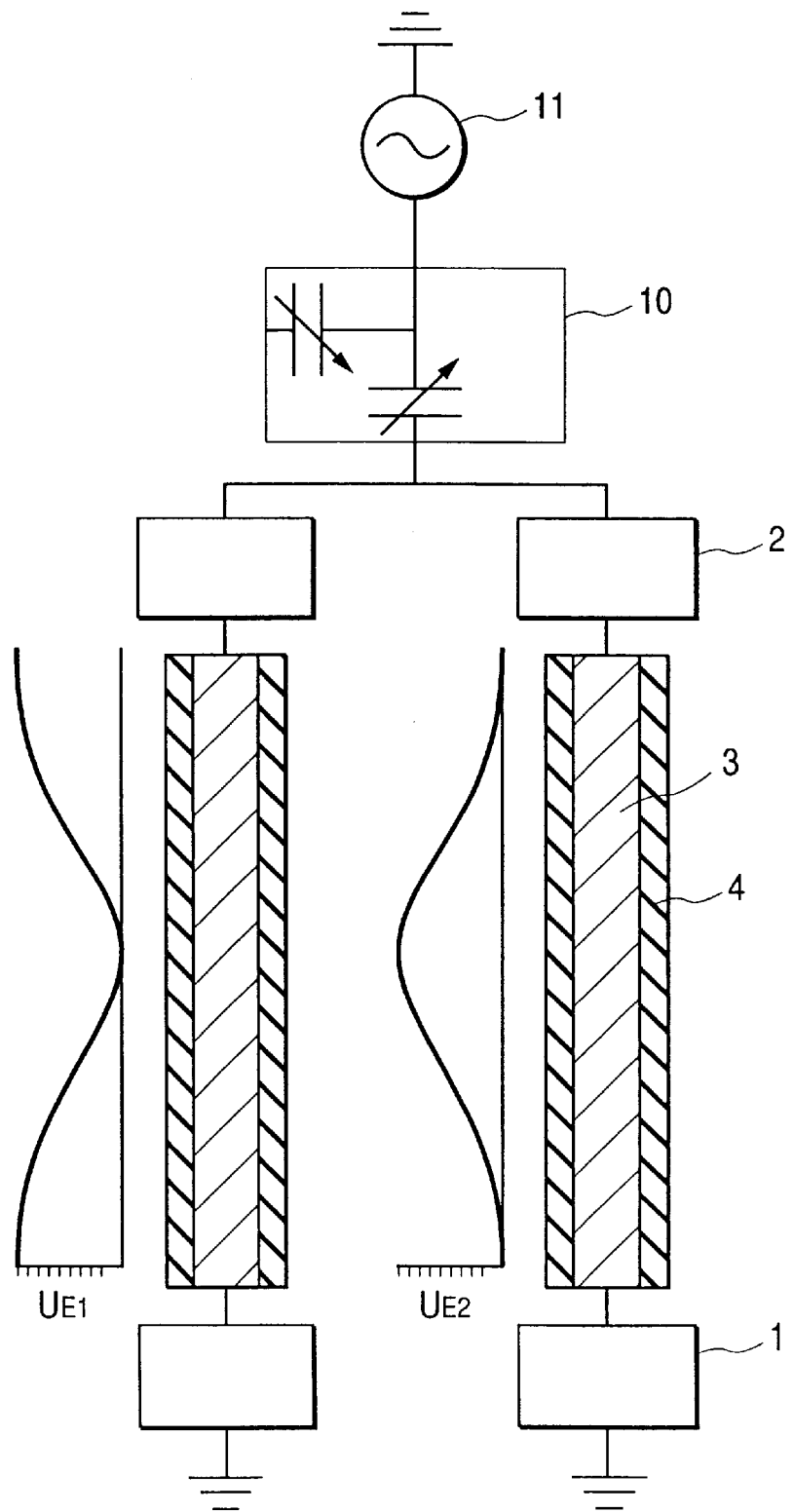
FIGS. 3A and 3B each schematically illustrate an example of how power is supplied to a plasma-producing high-frequency electrode and a phase-adjusting circuit is connected.
Figure 3B:
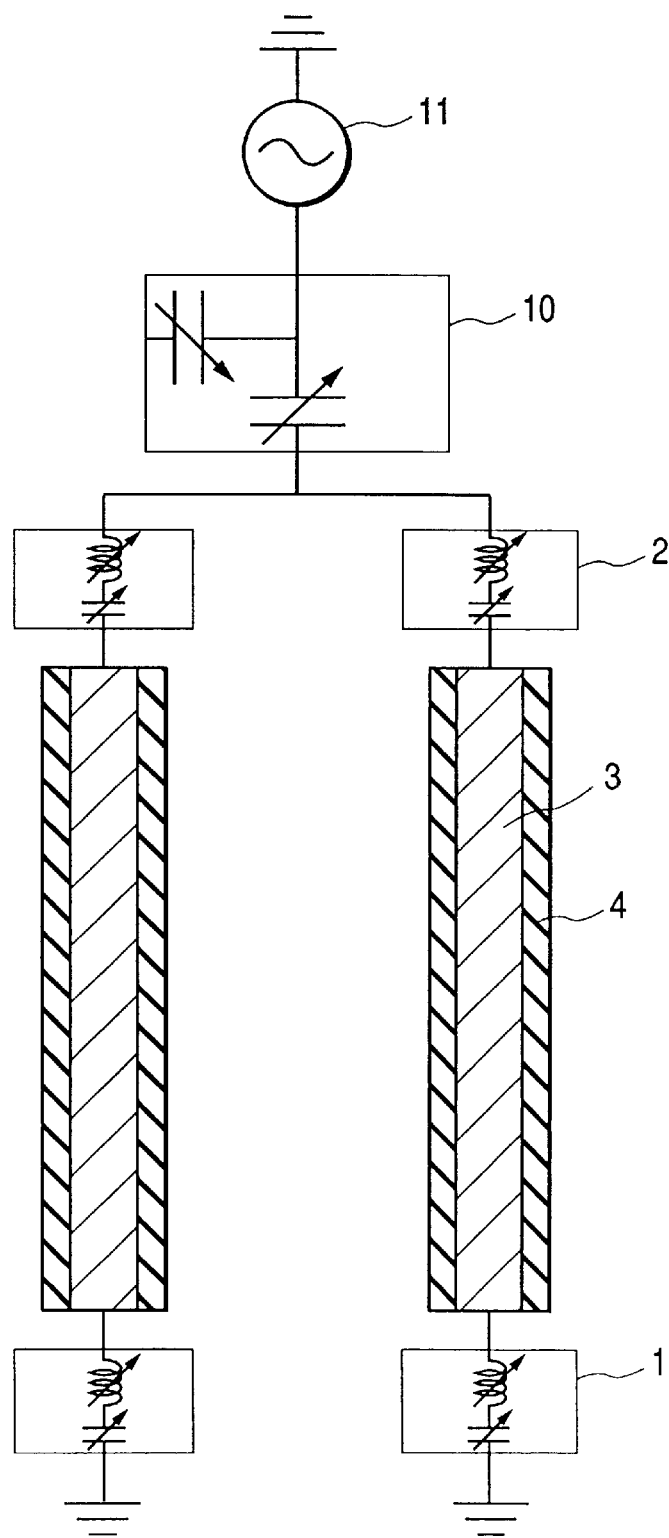

First, the plasma-producing high-frequency electrode used in the high-frequency plasma CVD system of the present invention will be described with reference to FIGS. 3A and 3B. To simplify description, columnar rod-like electrodes are used as plasma-producing high-frequency electrodes 3 and hollow cylindrical dielectric members 4 are provided around them. When plasma (not shown) is produced around the dielectric, a coaxial waveguide is formed in which each plasma-producing high-frequency electrode 3 serves as an internal conductor, the plasma as an external conductor and the dielectric member 4 as a transmission medium. Each plasma-producing high-frequency electrode has a length which is ½ of wavelength λ in the coaxial waveguide at the frequency of a high-frequency power used and present in the coaxial waveguide. The high-frequency power generated by a high-frequency power source 11 is divided into two parts through a matching circuit 10 so that the high-frequency power can be supplied in a good efficiency for loading; and is further supplied to each high-frequency electrode through each auxiliary matching circuit 2 correspondingly to differences in matching conditions, depending on differences in individuals of the respective high-frequency electrodes 3. FIG. 3A also shows electric-field energy distribution of standing waves produced when a phase-adjusting circuit 1 at an end of the left-side high-frequency electrode 3 is set as an open end and another phase-adjusting circuit 1 at an end of the right-side high-frequency electrode 3 is set as a closed end [the ordinate indicates electrode position; and the abscissa, electric-field energy (arbitrary unit)]. If the energy supplied to plasma from the plasma-producing high-frequency electrode is proportional to the electric-field energy of the high-frequency power, the uniformity of plasma in the direction Z is dramatically improved when two high-frequency electrodes are used as shown in FIGS. 3A and 3B, compared with an instance where one high-frequency electrode is used. In practice, plasma is not an ideal coaxial external conductor but an absorber having a fairly high-frequency power, and the diffusion or the like of plasma must also be taken into account. Accordingly, more uniform plasma can be formed by making appropriate phase adjustment, and also effective is a method in which the plasma-producing high-frequency electrodes are provided in a larger number according to circumstances. As the phase-adjusting circuit which adjusts the phase, what is called an LC circuit may be used, or, as a simple means, the electrodes may each be connected to a ground through a capacitor.

In an instance where the impedance of plasma changes greatly, it is better to use a variable capacitor or variable coil as in a phase-adjusting circuit shown in FIG. 3B. The phase-adjusting circuit shown in FIG. 3B is provided as a variable, series LC circuit. Alternatively, a parallel LC circuit may be used.

The amount of electric power applied to each high-frequency electrode is ill-balanced depending on the value of impedance of the phase-adjusting circuit in some cases. In such an instance, the plasma may be formed non-uniformly. When this occurs, the impedance of the auxiliary matching circuit 2 may be adjusted, whereby the proportion of the amount of electric power applied to each high-frequency electrode can be adjusted. As this auxiliary matching circuit 2, too, an LC circuit may be used.

In an instance where the impedance of plasma changes only a little, stationary LC circuits may be used in both the phase-adjusting circuit and the auxiliary matching circuit without any problem.

For the plasma-producing high-frequency electrode of the present invention, the high-frequency power used may preferably have a frequency in the range of from 30 to 600 MHz.

Figure 4:
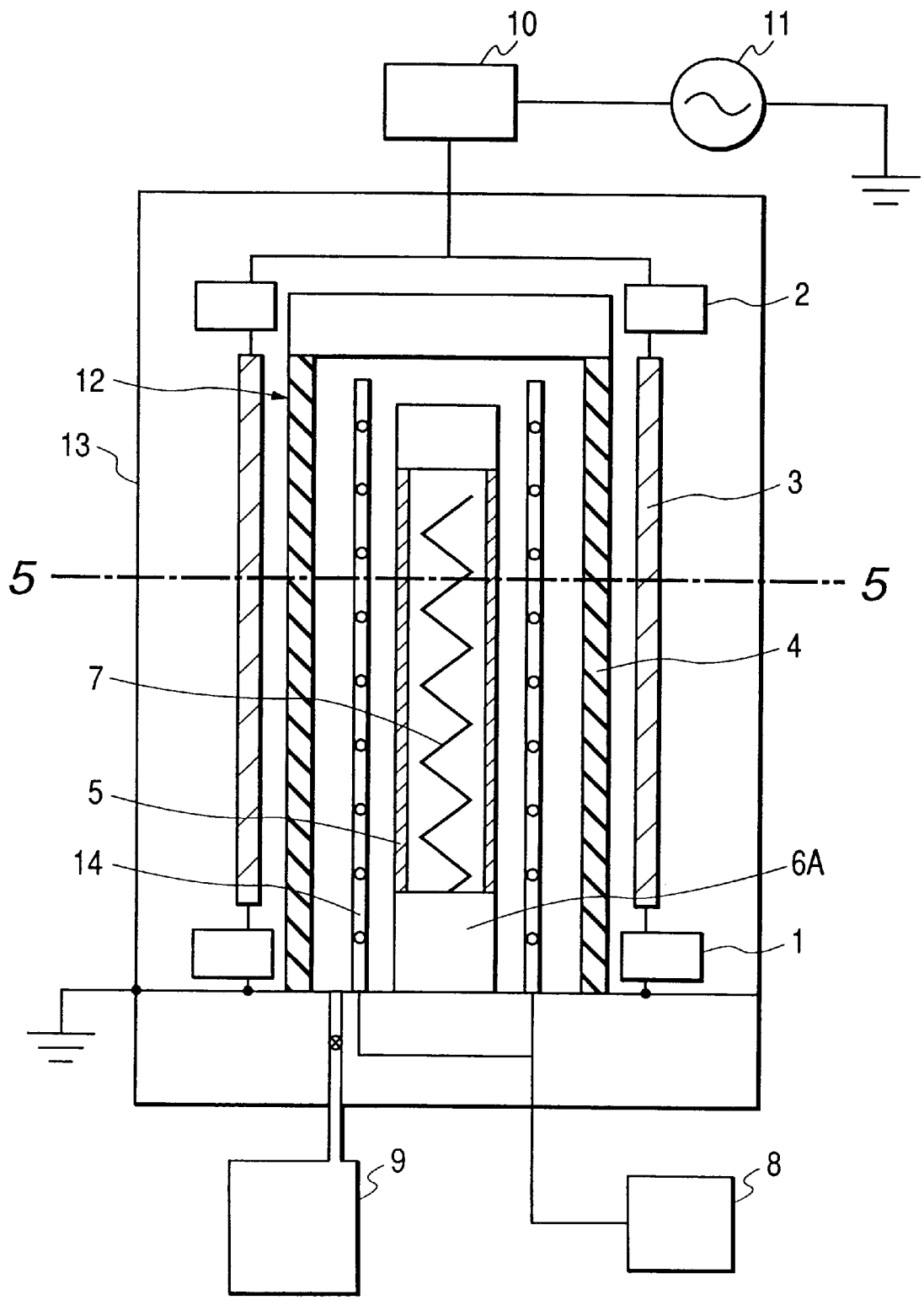
FIG. 4, FIG. 5, FIG. 6, FIG. 7 and FIG. 8 are each diagrammatic cross-sectional view illustrating a preferred example of a plasma CVD system having phase-adjusting circuits.
Figure 5:
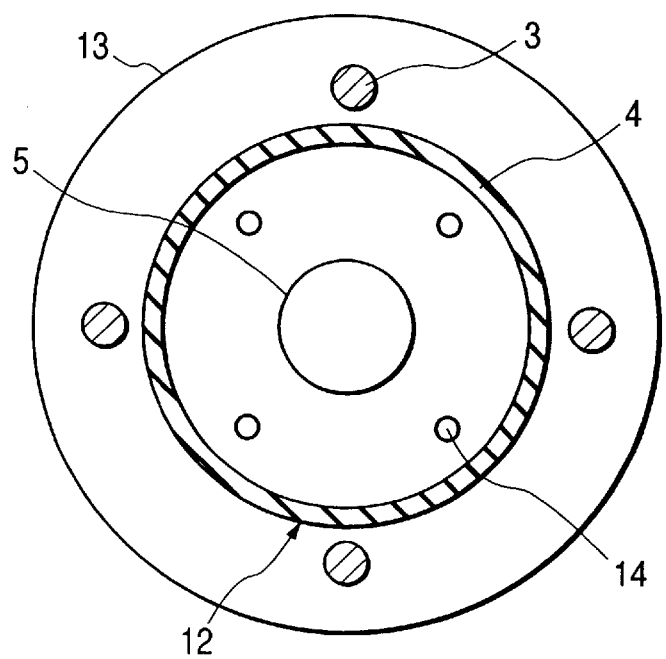

In the plasma CVD system and the plasma CVD process which make use of the plasma-producing high-frequency electrodes of the present invention, constituted as described above, the plasma-producing high-frequency electrodes can form a uniform plasma, and hence a deposited film having film quality and film thickness in a very good uniformity can be formed. This will be detailed below. FIGS. 4 and 5 illustrate a plasma CVD system as a preferred example of the plasma CVD system of the present invention. FIG. 5 is a cross-sectional view along the line 5—5 in FIG. 4. In FIGS. 4 and 5, reference numeral 12 denotes a reactor.

Inside the reactor 12, one substrate holder 6A is placed at the center of the reactor. Reference numeral denotes a cylindrical film-forming substrate provided on the substrate holder 6A.

The substrate holder 6A is provided internally with a heater 7 so that the cylindrical film-forming substrate 5 can be heated on the inside. The substrate holder 6A is also connected to a shaft (not shown) connected to a motor (not shown), so as to be set rotatable.

Reference numeral 6B denotes an auxiliary substrate holder for the cylindrical film-forming substrate 5. Reference numeral 3 denotes a high-frequency electrode (provided in plurality) to which a high-frequency power is applied and which is positioned at the center of a plasma region. The high-frequency power is generated in a high-frequency power source 11, divided through a matching circuit 10, and supplied to one end of each high-frequency electrode 3 through an auxiliary matching circuit 2.

Each high-frequency electrode 3 is isolated from the discharge space via a dielectric member 4 constituting a part of the reactor 12, and is grounded through a phase-adjusting circuit 1 at an end on the side opposite to the feeding point.

Gases are exhausted by a vacuum exhaust means 9 having a vacuum pump, through an exhaust pipe having an exhaust valve. Reference numeral 8 denotes a material gas feed assemblage constituted of gas cylinders, mass-flow controllers, valves and so forth, which is connected to gas release pipes having a plurality of gas release holes, through a gas feed pipe.

Plasma CVD using this system is carried out in the following way. After the inside of the reactor 12 is evacuated to a high vacuum by means of the exhaust mechanism 9, reaction gases are fed into the reactor 12 from the gas feed means 8 through the gas feed pipes and gas release pipes, and its inside is kept at a predetermined pressure. In this state, a high-frequency power is supplied from the high-frequency power source 11, after it is divided through the matching circuit 10, to each high-frequency electrode 3 through the auxiliary matching circuit 2 to cause plasma to take place across the high-frequency electrodes and the cylindrical film-forming substrate 5. Thus, the reaction gases are decomposed and excited by plasma to form a deposited film on the cylindrical film-forming substrate 5.

In the present invention, as a dielectric material used in the dielectric member 4, any known material may be selected. A material having a small dielectric loss may preferably be used. Those having a dielectric loss tangent of 0.01 or below are preferred, and those of 0.001 or below are more preferred. As polymeric dielectric materials, polytetrafluoroethylene, polytrifluorochloroethylene, polyfluoroethylene propylene and polyimide are preferred. As glass materials, quartz glass and borosilicate glass are preferred. As ceramic materials, preferred are boron nitride, silicon nitride, aluminum nitride, and ceramics composed chiefly of one or more element oxides among element oxides such as aluminum oxide, magnesium oxide and silicon oxide.

In the present invention, the high-frequency electrode 3 may preferably have the shape of a rod such as a column, a cylinder or a polygonal pillar, or a long plate.

In the present invention, the high-frequency power generated from the high-frequency power source 11 may preferably have a frequency in the range of from 30 to 600 MHz, and more preferably from 60 to 300 MHz.

Figure 7:
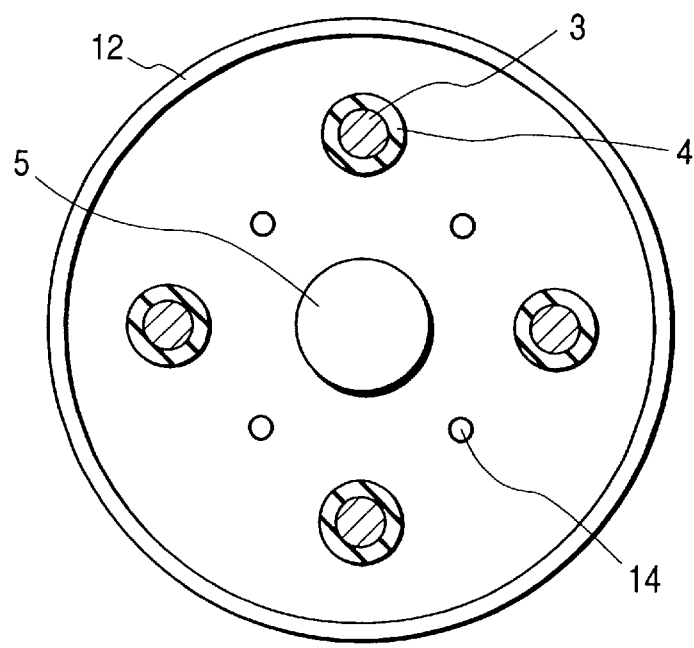
Figure 6:
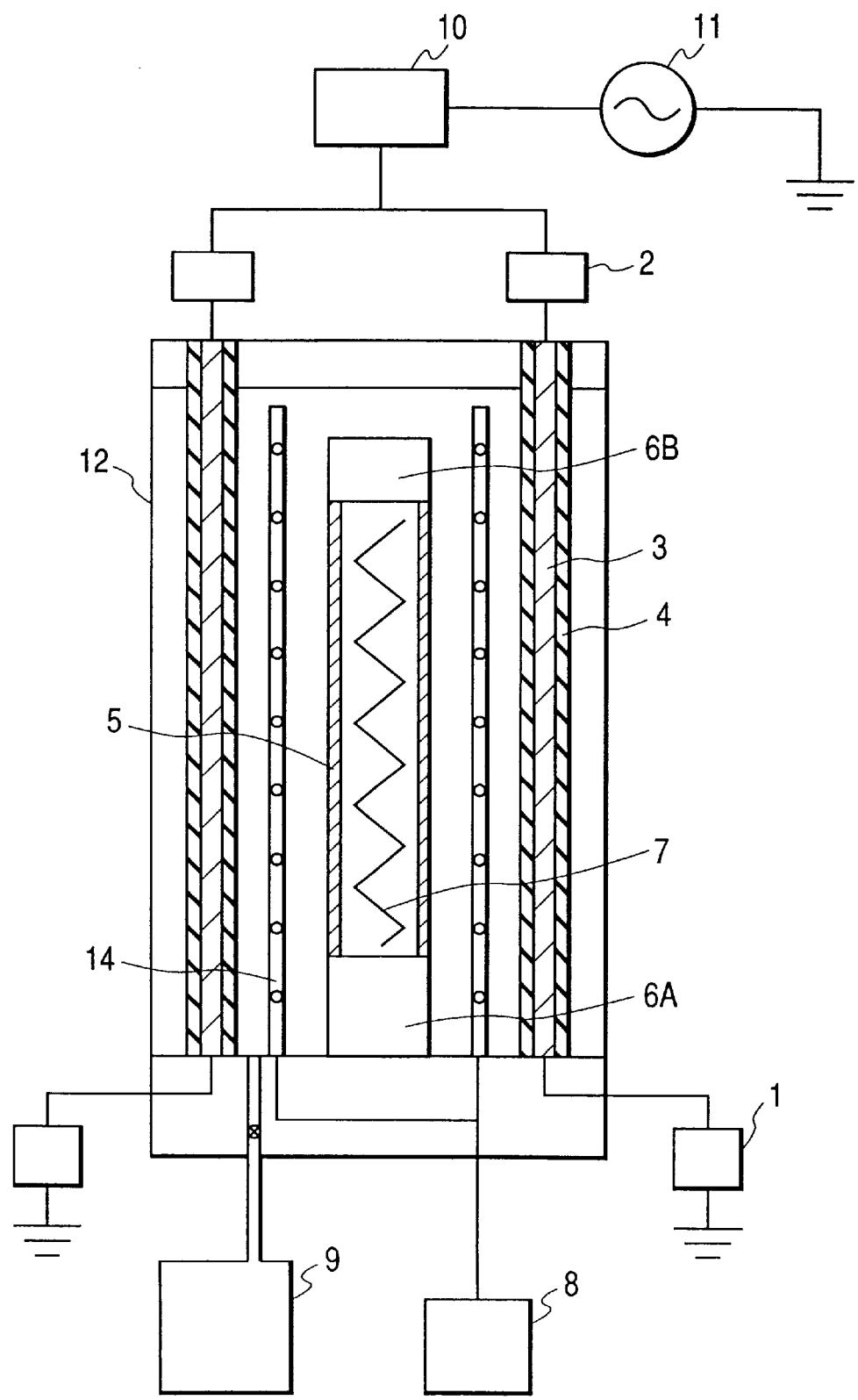

In the present invention, the system may be constituted as shown in FIGS. 6 and 7, in which a plurality of high-frequency electrodes 3 are disposed around a cylindrical film-forming substrate 5 in such a way that their one ends passes through the top wall of a reactor 12.

More specifically, in the system shown in FIGS. 6 and 7, high-frequency electrodes 3 each covered with a dielectric material 4 are provided as high-frequency power feed means around the film-forming substrate 5. In the present embodiment, four high-frequency power feed means are provided at equal intervals. Gas release pipes 14 are provided between these high-frequency power feed means.

Figure 8:
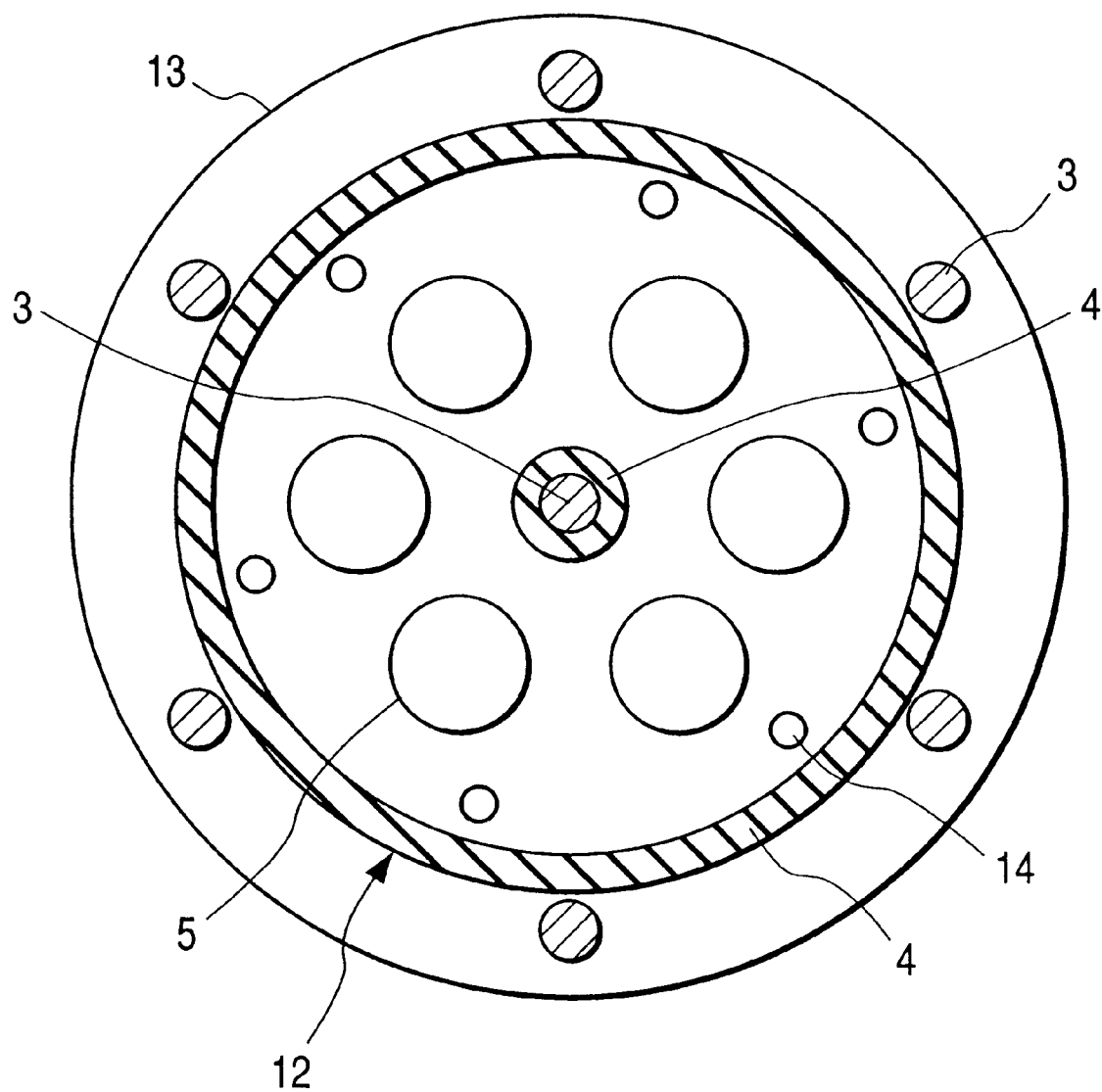

In the present invention, the system may also be constituted as shown in FIG. 8, in which a plurality of cylindrical film-forming substrates 5 are arranged on the same circumference.

The system shown in FIG. 8 has a high-frequency electrode 3 covered with a dielectric material 4, provided at the center of a reactor 12, and a plurality of high-frequency electrodes 3 provided on the outer side of another dielectric material 4 constituting the reactor 12, i.e., around the outer side of the reactor 12. The film-forming substrates 5 are so provided as to surround the high-frequency electrode 3 provided at the center of the reactor 12, and the gas release pipes 14 are so disposed as to be positioned between the respective film-forming substrates 5. The high-frequency electrodes 3 on the outer side of the reactor 12 are also provided between the film-forming substrates 5 at positions with equal distance to the adjoining film-forming substrates 5. An earth shield 13 surrounds the outer-side high-frequency electrodes to prevent the high-frequency power from leaking out.

Figure 9:
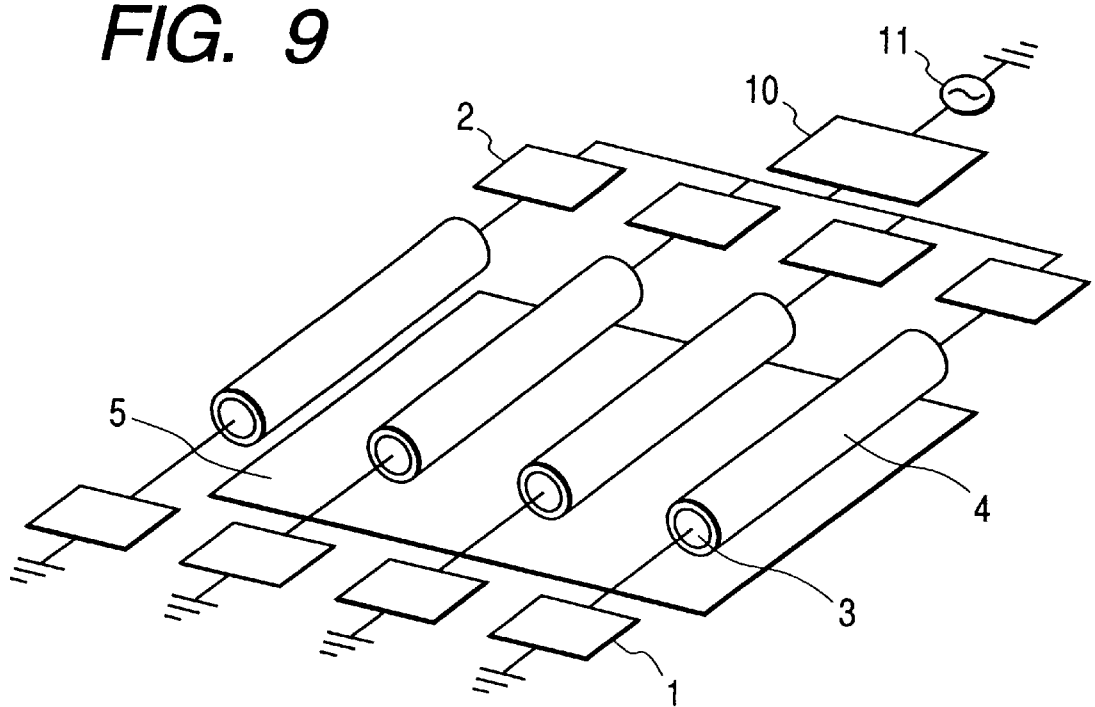
FIG. 9 and FIG. 10 are each diagrammatic perspective view illustrating a preferred example of a plasma CVD system having phase-adjusting circuits.

In the present invention, the system may also be constituted as shown in FIG. 9, in which a plurality of high-frequency electrodes 3 are disposed in parallel to a flat-plate film-forming substrate 5. With this constitution, a high-quality deposited film having a very uniform film thickness and a homogeneous film quality can be formed on a large-area flat-plate film-forming substrate at a high deposition rate.

Figure 10:
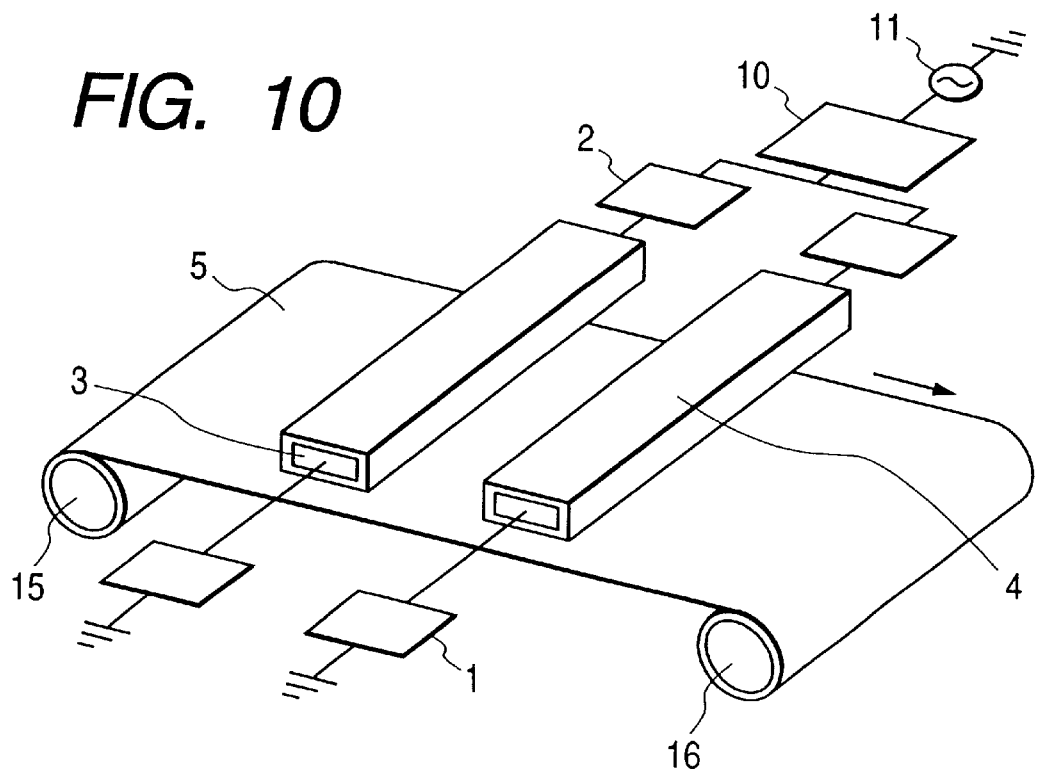

In the present invention, the system may also be constituted as shown in FIG. 10, in which a plurality of high-frequency electrodes 3 are disposed in parallel to a continuous sheet-like film-forming substrate 5 which is wound off from a holding roll 15 at the time of film formation and wound up on a wind-up roll after film formation. With this constitution, a high-quality deposited film having a very uniform film thickness and a homogeneous film quality can be formed on a large-area continuous sheet-like film-forming substrate at a high deposition rate.

In use of the plasma CVD system of the present invention, as the gases used, known material gases contributory to film formation may be used under appropriate selection in accordance with the types of deposited films to be formed. For example, when a-Si (amorphous silicon) type deposited films are formed, preferable material gases may include silane, disilane, high disilane, and mixed gases of any of these. When different type deposited films are formed, they may include, e.g., material gases such as germane, methane and ethylene, and mixed gases of any of these. In either case, material gases for film formation may be introduced into the reactor together with a carrier gas. The carrier gas may include hydrogen gas and inert gases such as argon gas and helium gas.

Property-improving gases for, e.g., controlling band gaps of deposited films may also be used. Such gases may include, e.g., gases containing nitrogen atoms, such as nitrogen and ammonia; gases containing oxygen atoms, such as oxygen, nitrogen dioxide and dinitrogen oxide; hydrocarbon gases such as methane, ethane, ethylene, acetylene and propane; gaseous fluorine compounds such as silicon tetrafluoride, disilicon hexafluoride and germanium tetrafluoride; and mixed gases of any of these.

Dopant gases may also be used for the doping of deposited films to be formed. Such dopant gases may include, e.g., gaseous diborane, boron fluoride, phosphine and phosphorus fluoride.

Substrate temperature at the time of the formation of deposited films may be set appropriately. When amorphous silicon type deposited films are formed, the temperature may preferably be set at from 60° C. to 400° C., and more preferably from 100° C. to 350° C.

The phase adjustment of the high-frequency electrodes may preferably be so made that the phases of reflected waves on adjoining high-frequency electrodes differ from each other. In particular, the phase adjustment may preferably be so made as to compensate the strength or weakness of electric-field energy distribution around the adjoining high-frequency electrodes.

In the present invention, the plasma CVD system may be so constituted that the plasma-producing high-frequency electrode is provided with an auxiliary matching circuit on the power supply side of the electrode and the high-frequency power branches through the auxiliary matching circuit from the high-frequency power source provided in a smaller number than the number of the plasma-producing high-frequency electrode, to control the high-frequency power supplied to each high-frequency electrode.

In such an instance, the auxiliary matching circuit may be constituted of an LC circuit.

A dielectric member may preferably be provided between the plasma-producing high-frequency electrode and the space in which the plasma takes place.

The high-frequency electrode may be provided in plurality and a plurality of high-frequency electrodes may be arranged outside the reactor in which a film-forming substrate has been provided, and upright on substantially the same circumference in such a way that the high-frequency electrodes surround the reactor; the reactor being formed of a dielectric member at least in part.

Alternatively, the high-frequency electrode may be provided in plurality and a plurality of high-frequency electrodes may be arranged inside the reactor in which a film-forming substrate has been provided, and upright on substantially the same circumference in such a way that the high-frequency electrodes surround the film-forming substrate.

Still alternatively, the high-frequency electrode may be provided in plurality and a plurality of high-frequency electrodes may be arranged inside or outside the reactor in which a plurality of film-forming substrates have been provided, and upright on substantially the same circumference in such a way that the high-frequency electrodes surround the film-forming substrates.

The film-forming substrate may preferably be so provided as to be rotatable by means of a rotating mechanism. In this instance, the film-forming substrate may preferably have a cylindrical shape.

EXAMPLES

The present invention will be described below by giving Examples. The present invention is by no means limited by these.

Example 1

A plasma CVD system used in the present Example is the one diagrammatically illustrated in FIGS. 4 and 5. FIG. 5 is a cross-sectional view along the line 5—5 in FIG. 4. As the high-frequency power source 11, a power source able to output a power having a frequency in the range of from 13.56 MHz to 650 MHz was used. The high-frequency electrodes 3 used has the shape of columns, which are disposed outside the reactor 12 and are isolated from the discharge space via a dielectric member 4 made of an alumina ceramic. The high-frequency electrodes are each so set up as to have a feeding point of the high-frequency power at its one end and be grounded through the phase-adjusting circuit 1 on the opposite-side end. As the phase-adjusting circuits 1, those able to adjust the reactance to ground were used. In the present Example, with regard to high-frequency electrodes 3 shared by one set of opposing phase-adjusting circuits among four phase-adjusting circuits 1, these high-frequency electrodes were short-circuited directly to grounds inside the reactor 12, and those shared by the remaining opposing one set were not connected to grounds but set substantially as open ends of only the stray capacitance in the phase-adjusting circuits.

A cylindrical film-forming substrate made of aluminum and having a diameter of 108 mm, a length of 358 mm and a wall thickness of 5 mm was set in the reactor 12 and film formation was tested while rotating the substrate. In this test, columnar electrodes made of aluminum, having a diameter of 20 mm and a length of 450 mm, were used as the high-frequency electrodes 3. For the evaluation of film quality, a Corning #7059 glass substrate on which a comb type electrode with gaps of 250 μm made of chromium had been vacuum-deposited was set as an electrical property evaluation substrate (a substrate for evaluating electrical properties) on the surface of the cylindrical film-forming substrate over the length of 358 mm in its axial direction. The test was made in the following way.

First, the inside of the reactor 12 was evacuated by operating the exhaust mechanism 9, and the inside of the reactor 12 was adjusted to a pressure of $1 \times 10^{-6}$ Torr. Next, the substrate heater was electrified to heat the cylindrical film-forming substrate 5 and keep it at a temperature of 250° C. Then, films were formed in the following procedure: $SiH_4$ gas was fed from the material gas feed means 8 through the gas release pipes 14 into the reactor 12 at a flow rate of 500 sccm, and the inside of the reactor was adjusted to a pressure of 10 mm Torr. In this state, the high-frequency power was generated by the high-frequency power source 211 at frequencies within the range of from 13.56 MHz to 650 MHz. The high-frequency power was divided into four parts through the matching circuit 10, and then supplied equally to the high-frequency electrodes 3 through the auxiliary matching circuits 2. Here, as the high-frequency power source 11, a predetermined high-frequency power source was used so as to provide the frequencies within the above range. The matching circuit 10 was adjusted appropriately in accordance with the frequencies of the high-frequency power source. Thus, amorphous silicon films were formed on the cylindrical film-forming substrate 5 and the electrical property evaluation substrate described above.

With regard to the amorphous silicon films thus formed, their film quality, film quality distribution, deposition rate and deposition rate distribution were evaluated in the following manner.

The film quality and film quality distribution were evaluated by measuring light/dark conductivity ratio {(photoconductivity σp)/dark conductivity σd)} at 18 points at intervals of about 20 mm on the electrical property evaluation substrate over its top end to its bottom end. Here, the photoconductivity σp is evaluated by conductivity at the time of irradiation by light of a He—Ne laser (wavelength:

632.8 nm) with an intensity of 1 mW/cm². According to findings obtained by the present inventors from the manufacture of electrophotographic photosensitive members, images which are worthy of practical use can be formed on electrophotographic photosensitive members manufactured under optimum conditions on the basis of conditions under which deposited films having such quality that the light/dark conductivity ratio measured in the above manner is $10^3$ or more are obtainable. However, taking account of the trend in recent years toward higher contrast of images, it has become preferable for deposited films to have a light/dark conductivity ratio of $10^4$ or more, and it is foreseen that a light/dark conductivity ratio of $10^5$ or more is required in the near future. From such a point of view, the value of the light/dark conductivity ratio was evaluated according to the following ranks.

AA: Light/dark conductivity ratio is $10^5$ or more, showing very good film properties.

A: Light/dark conductivity ratio is $10^4$ or more, showing good film properties.

B: Light/dark conductivity ratio is $10^3$ or more, and no problem in practical use.

C: Light/dark conductivity ratio is less than $10^3$, and not suited for practical use in some cases.

The deposition rate and deposition rate distribution were evaluated by measuring film thickness by the use of an eddy current film thickness meter (manufactured by Kett Kagaku Kenkyusho) at 18 points at intervals of about 20 mm like the positions of measurement of the above light/dark conductivity ratio, on the a-Si film-formed cylindrical substrate in its axial direction. The deposition rate was calculated on the basis of the film thicknesses at 18 points, and an average value of the values obtained was regarded as an average deposition rate. The deposition rate distribution was evaluated in the following way: With regard to deposition rate distribution in the axial direction, a difference between the maximum value and the minimum value in deposition rate at the 18 points in the axial direction was determined, and its error was divided by the average deposition rate of 18 points to determine deposition rate distribution {(maximum value−minimum value)/average value}, which was expressed by percentage as deposition rate distribution in the axial direction.

The results of evaluation of the light/dark conductivity ratio, average deposition rate and deposition rate distribution of the film-formed samples are shown in Table 1.

In the case of 13.56 MHz, no discharge took place at 10 mTorr and hence the evaluation was impossible.

With regard to samples on which films were formed using high-frequency power having a frequency of 30 MHz, the light/dark conductivity ratio was within the range of from $1 \times 10^4$ to $3 \times 10^4$ in all the samples, showing good film properties "A" (Table 1). The average deposition rate was 2.0 nm/second and the deposition rate distribution was 3%.

With regard to samples on which films were formed using high-frequency power having a frequency of from 60 MHz to 300 MHz, the light/dark conductivity ratio was within the range of from $1 \times 10^5$ to $5 \times 10^5$ in all the samples, showing very good film properties "AA" (Table 1). The average deposition rate was from 4.0 to 7.1 nm/second and the deposition rate distribution was from 4 to 5%.

With regard to samples on which films were formed using high-frequency power having a frequency of from 400 MHz to 600 MHz, the light/dark conductivity ratio was within the range of from $5 \times 10^4$ to $8 \times 10^4$, showing good film properties "A" (Table 1). The average deposition rate was from 2.0 to 2.8 nm/second and the deposition rate distribution was from 6 to 7%.

In the case of 650 MHz, the discharge was too unstable to form deposited films.

Thus, in the present Example, amorphous silicon films having good light/dark conductivity ratio and good average deposition rate and deposition rate distribution are obtained under discharge frequency conditions of from 30 MHz to 600 MHz, and especially superior amorphous silicon films were obtained at frequencies of from 60 MHz to 300 MHz.

Comparative Example 1

A system in which all the phase-adjusting circuits 1 were detached and the ends of all the cathode electrodes (high-frequency electrodes) 3 were set as open ends was examined under the same conditions as in Example 1, and evaluation was made in the same manner as in Example 1. The results of evaluation are shown in Table 2. Compared with the results of Example 1 shown in Table 1, the light/dark conductivity ratio is greatly low and the deposition rate distribution is greatly non-uniform, at the all discharge frequencies.

TABLE 1

| Power source frequency (MHz) | Light/dark conductivity ratio | | | | | | | | | | | | | | | | | Average deposition rate (nm/s) | Deposition rate distribution (%) |
|---|---|---|---|---|---|---|---|---|---|---|---|---|---|---|---|---|---|---|---|
| | Top side (high-frequency power feeding side) | | | | | | ← Middle portion → | | | | | | | | | | Bottom side (phase-adjusting circuit side) | | |
| 30 | A | A | A | A | A | A | A | A | A | A | A | A | A | A | A | A | A | A | 2.0 | 3 |
| 60 | AA | AA | AA | AA | AA | AA | AA | AA | AA | AA | AA | AA | AA | AA | AA | AA | AA | AA | 4.0 | 4 |
| 100 | AA | AA | AA | AA | AA | AA | AA | AA | AA | AA | AA | AA | AA | AA | AA | AA | AA | AA | 6.4 | 4 |
| 200 | AA | AA | AA | AA | AA | AA | AA | AA | AA | AA | AA | AA | AA | AA | AA | AA | AA | AA | 7.1 | 4 |
| 300 | AA | AA | AA | AA | AA | AA | AA | AA | AA | AA | AA | AA | AA | AA | AA | AA | AA | AA | 5.6 | 5 |
| 400 | A | A | A | A | A | A | A | A | A | A | A | A | A | A | A | A | A | A | 2.8 | 6 |
| 500 | A | A | A | A | A | A | A | A | A | A | A | A | A | A | A | A | A | A | 2.4 | 7 |
| 600 | A | A | A | A | A | A | A | A | A | A | A | A | A | A | A | A | A | A | 2.0 | 7 |

TABLE 2

| Power source frequency (MHz) | Top side (high-frequency power feeding side) | | | | | | ← Middle portion → | | | | | | | | Bottom side (phase-adjusting circuit side) | | | Average deposition rate (nm/s) | Rate distribution (%) |
|---|---|---|---|---|---|---|---|---|---|---|---|---|---|---|---|---|---|---|---|
| 30  | B  | B  | C  | C  | C  | B  | B  | B  | B  | B  | B  | B  | A  | A  | A  | A  | A  | A  | 1.8 | 11 |
| 60  | AA | A  | A  | B  | B  | C  | C  | B  | A  | A  | AA | AA | AA | AA | AA | AA | AA | AA | 3.3 | 18 |
| 100 | AA | AA | AA | AA | A  | A  | B  | C  | C  | B  | A  | AA | AA | AA | AA | AA | AA | AA | 5.7 | 24 |
| 200 | AA | AA | AA | AA | AA | A  | A  | B  | C  | C  | C  | B  | A  | AA | AA | AA | AA | AA | 6.5 | 29 |
| 300 | A  | A  | AA | AA | AA | AA | AA | AA | A  | B  | C  | C  | B  | A  | AA | AA | AA | AA | 4.8 | 32 |
| 400 | A  | A  | B  | C  | C  | B  | A  | A  | A  | A  | C  | C  | C  | A  | A  | A  | A  |    | 2.3 | 38 |
| 500 | A  | A  | B  | B  | C  | C  | B  | A  | A  | A  | A  | A  | C  | C  | C  | B  | A  | A  | 1.9 | 40 |
| 600 | A  | C  | C  | A  | A  | B  | C  | C  | C  | B  | A  | A  | A  | C  | C  | C  | B  | A  | 1.4 | 44 |

Example 2

Using the system shown in FIGS. 4 and 5, electrophotographic photosensitive members were produced under the conditions where the value of a light/dark conductivity ratio of $10^5$ or more was obtained in Example 1, i.e., under conditions of power source frequencies 60 MHz, 100 MHz, 200 MHz and 300 MHz each. As the phase-adjusting circuits 1, the same ones as those used in Example 1 were used. The high-frequency electrodes 3 on their side opposite to the feeding points were set in the same manner as in Example 1. The electrophotographic photosensitive members were each produced by forming a charge injection blocking layer, a photoconductive layer and a surface protective layer in this order on a cylindrical film-forming substrate made of aluminum, under film-forming conditions shown in Table 3.

On the samples obtained under the respective conditions of power source frequencies, their chargeability, image density and faulty images were evaluated. As the result, all the electrophotographic photosensitive members showed very good results on these evaluation items over the whole areas of the electrophotographic photosensitive members. As was seen from these results, all the electrophotographic photosensitive members had superior electrophotographic performances.

TABLE 3

| Electrophotographic photosensitive member layers | Film-forming conditions |
|---|---|
| Surface protective layer: Gas flow rate: | |
| $SiH_4$ | 100 sccm |
| $H_2$ | 100 sccm |
| $CH_4$ | 500 sccm |
| Power applied: | 800 W |
| Reaction pressure: | 10 mTorr |
| Film thickness: | 1 μm |
| Photoconductive layer: Gas flow rate: | |
| $SiH_4$ | 500 sccm |
| $H_2$ | 500 sccm |
| Power applied: | 1,000 W |
| Reaction pressure: | 10 mTorr |
| Film thickness: | 30 μm |
| Charge injection blocking layer: Gas flow rate: | |
| $SiH_4$ | 400 sccm |
| $H_2$ | 400 sccm |
| NO | 500 sccm |

TABLE 3-continued

| Electrophotographic photosensitive member layers | Film-forming conditions |
|---|---|
| $B_2H_6$ (based on $SiH_4$ flow rate) | 2,000 ppm |
| Power applied: | 800 W |
| Reaction pressure: | 10 mTorr |
| Film thickness: | 2 μm |

Example 3

Using the system shown in FIGS. 6 and 7, a cylindrical film-forming substrate 5 made of aluminum and having a diameter of 108 mm, a length of 358 mm and a wall thickness of 5 mm was set in the reactor 12 to form films. As the high-frequency electrodes, the same ones as those in Example 1 were set in the reactor, and those covered with dielectric members 4 were used. Four high-frequency electrodes were disposed in the reactor as shown in FIG. 7. Using a high-frequency power source able to apply a power having a frequency of 100 MHz, an amorphous silicon film was formed on the cylindrical film-forming substrate under the same film-forming conditions as in Example 1. The light/dark conductivity ratio, deposition rate and deposition rate distribution were evaluated in the same manner as in Example 1. The high-frequency electrodes 3 on their side opposite to the feeding points were set in the same manner as in Example 1.

As the result, the light/dark conductivity ratio was from $1\times10^5$ to $3\times10^5$ at all positions, the average deposition rate was 6.7 nm/second and the deposition rate distribution was 4%. Thus, an amorphous silicon film having uniform and good properties was obtained.

Example 4

Electrophotographic photosensitive members were produced under the same system constitution as used in Example 3.

The electrophotographic photosensitive members were each produced by forming a charge injection blocking layer, a photoconductive layer and a surface protective layer in this order on a cylindrical film-forming substrate made of aluminum, in the same manner as in Example 2 under film-forming conditions shown in Table 3. On the samples obtained, their chargeability, image density and faulty images were evaluated. As the result, all the electrophotographic photosensitive members also showed very good results on these evaluation items over the whole areas of the electrophotographic photosensitive members. As was seen from these results, all the electrophotographic photosensitive members had superior electrophotographic performances.

Example 5

Using the system shown in FIG. 8, cylindrical film-forming substrates 5 each made of aluminum and having a diameter of 108 mm, a length of 358 mm and a wall thickness of 5 mm were set in the reactor 12 to form films. To set up the high-frequency electrodes 3, the same ones as those in Example 1 were used as seven high-frequency electrodes 3, six of which were disposed outside the reactor 12 and one of which was disposed at the center of the reactor, in the manner as shown in FIG. 8. The reactor 12 is constituted of a dielectric member 4 in part, and is so designed that the high-frequency power from the high-frequency electrodes disposed outside the reactor can be fed into the reactor 12. The high-frequency electrode 3 inserted to the center of the reactor is covered with a dielectric member 4. The phase-adjusting circuit (not shown) connected to the center high-frequency electrode is short-circuited to a ground and the phase-adjusting circuits (not shown) connected to the surrounding six high-frequency electrodes 3 are connected to grounds through capacitors each having inside an electrostatic capacity of 20 pF. As the capacitors, any types such as ceramic capacitors and vacuum capacitors may be used. A high-frequency power source able to apply a power having a frequency of 100 MHz was used. Films were formed under conditions of a high-frequency power of 4 kW, an $SiH_4$ flow rate of 1,500 cc, a film-forming pressure of 10 mTorr and a substrate temperature of 250° C., and amorphous silicon films were formed on the six cylindrical film-forming substrates. The light/dark conductivity ratio, deposition rate and deposition rate distribution were evaluated in the same manner as in Example 1.

As the result, the light/dark conductivity ratio was from $1 \times 10^5$ to $3 \times 10^5$ at all positions, the average deposition rate was 6.2 nm/second and the deposition rate distribution was 5%. Thus, amorphous silicon films having uniform and good properties were obtained.

Example 6

Electrophotographic photosensitive members were produced under the same system constitution as used in Example 5.

The electrophotographic photosensitive members were produced by forming a charge injection blocking layer, a photoconductive layer and a surface protective layer in this order on each of the six cylindrical film-forming substrates made of aluminum, under film-forming conditions shown in Table 4. On the samples obtained, their chargeability, image density and faulty images were evaluated. As the result, all the electrophotographic photosensitive members also showed very good results on these evaluation items over the whole areas of the electrophotographic photosensitive members. As was seen from these results, all the electrophotographic photosensitive members had superior electrophotographic performances.

TABLE 4

| Electrophotographic photosensitive member layers | Film-forming conditions |
|---|---|
| Surface protective layer: Gas flow rate: | |
| $SiH_4$ | 300 sccm |
| $H_2$ | 300 sccm |
| $CH_4$ | 1,500 sccm |
| Power applied: | 3,000 W |
| Reaction pressure: | 5 mTorr |
| Film thickness: | 1 μm |
| Photoconductive layer: Gas flow rate: | |
| $SiH_4$ | 1,500 sccm |
| $H_2$ | 1,500 sccm |
| Power applied: | 4,000 W |
| Reaction pressure: | 10 mTorr |
| Film thickness: | 30 μm |
| Charge injection blocking layer: Gas flow rate: | |
| $SiH_4$ | 1,000 sccm |
| $H_2$ | 1,000 sccm |
| NO | 1,200 sccm |
| $B_2H_6$ (based on $SiH_4$ flow rate) | 2,000 ppm |
| Power applied: | 2,500 W |
| Reaction pressure: | 10 mTorr |
| Film thickness: | 2 μm |

Example 7

Using the system shown in FIG. 9, a flat-plate film-forming substrate 5 made of glass and having a length of 500 mm, a width of 500 mm and a thickness of 1 mm was set in the reactor to form films. Four high-frequency electrodes 3 were disposed in the manner as shown in FIG. 9. One ends of the high-frequency electrodes were put together through the auxiliary matching circuits 2 and thereafter, through the matching circuit 10, connected to a high-frequency power source 11 having an oscillation at a frequency of 200 MHz. On the other ends of the high-frequency electrodes, the phases of reflected power are adjusted by the phase-adjusting circuits. This time, four phase-adjusting circuits were set as an open end, a short-circuit end, an open end and a short-circuit end in this order.

An amorphous silicon film was formed on the flat-plate film-forming substrate under film-forming conditions of a high-frequency power of 4 kW, an $SiH_4$ flow rate of 1,000 sccm, a film-forming pressure of 10 mTorr and a substrate temperature of 250° C., and the deposition rate and deposition rate distribution were evaluated in the following manner. On the flat-plate substrate on which the amorphous silicon film was formed, lines were drawn in its longitudinal direction at intervals of about 30 mm, and lines were also drawn in the lateral direction at intervals of about 30 mm, where, at its 256 points of intersection, film thickness was measured and deposition rate was calculated at each position of measurement in the same manner as in Example 1. An average value of the values obtained was regarded as an average deposition rate. The average deposition rate thus obtained was 7.4 nm/second. With regard to the deposition rate distribution, a difference between the maximum value and the minimum value in deposition rate at the 256 points of measurement was determined. Its error was divided by the average deposition rate, and the value obtained was expressed by percentage as deposition rate distribution. The deposition rate distribution thus obtained was 7%. The light/dark conductivity ratio was also evaluated in the same manner, which was found to be from $1\times10^5$ to $3\times10^5$ at all points of measurement. Thus, an amorphous silicon film having uniform and good properties was obtained.

Example 8

Using the system shown in FIG. 10, a continuous sheet-like substrate 5 made of stainless steel and having a width of 500 mm and a thickness of 0.1 mm was set in the reactor to form films while winding off the substrate from the holding roll 15 and winding up it on the wind-up roll 16. The high-frequency electrodes were set up using long-plate high-frequency electrodes 3 made of aluminum and having a cross section of 40 mm×10 mm size and a length of 600 mm, each covered with a 5 mm thick dielectric member 4 made of an alumina ceramic, and two plate-like high-frequency electrodes were disposed in the reactor. Using a high-frequency power source able to output a power having a frequency of 300 MHz, an amorphous silicon film was formed on the continuous sheet-like substrate under film-forming conditions of a high-frequency power of 2 kW, an $SiH_4$ flow rate of 750 cc, a film-forming pressure of 10 mTorr and a substrate temperature of 250° C. The phase-adjusting circuits 1 connected to one ends of the high-frequency electrodes 3 were set as an open end and a short-circuit end, and the phases of reflected power were adjusted by them.

The continuous sheet-like substrate was cut in a length of 500 mm, and the light/dark conductivity ratio, deposition rate and deposition rate distribution were evaluated in the same manner as in Example 6. The light/dark conductivity ratio was from $1\times10^5$ to $3\times10^5$ at all points of measurement, the average deposition rate was 4.5 nm/second and the deposition rate distribution was 5%. Thus, an amorphous silicon film having uniform and good properties was obtained.

As described above, the present invention is so constituted that the phase-adjusting circuit which adjusts the phase of reflected power is connected at an end on the side opposite to the feeding point of the plasma-producing high-frequency electrode. Hence, high-quality deposited films having a very uniform film thickness and a homogeneous film quality can be formed at a high rate on large-area substrates having various shapes, i.e., on cylindrical film-forming substrates, flat-plate substrates and continuous sheet-like substrates.

Thus, according to the present invention, large-area and high-quality semiconductor devices can be manufactured efficiently, in particular, large-area deposited films having superior electrophotographic performances can be mass-produced stably.

Incidentally, the adjustment of phase by the phase-adjusting circuit connected to the side opposite to the feeding point is not limited to open setting or short-circuit setting. The circuit may be set in any desired state by adjusting, e.g., a reactance to control the standing waves.

What is claimed is:

1. A plasma CVD system comprising a reactor the inside of which can be evacuated, a substrate holding means provided in the reactor, a material gas feed means for feeding into the reactor a material gas for plasma CVD, a high-frequency power supply means for supplying to a plasma-producing high-frequency electrode a high-frequency power having an oscillation frequency in the range of from 30 MHz to 600 MHz, generated by a high-frequency power source, and an exhaust means for exhausting a gas remaining in the reactor after the reaction; the high-frequency power generated in the high-frequency power source being supplied to the plasma-producing high-frequency electrode to cause a plasma to take place across a substrate held by the substrate holding means and the plasma-producing high-frequency electrode to form a deposited film on the substrate; wherein, a phase-adjusting circuit for adjusting the phase of reflected power is connected to the plasma-producing high-frequency electrode at its end portion on the opposite side of a feeding point at which the high-frequency power is supplied to the plasma-producing high-frequency electrode.

2. The plasma CVD system according to claim 1, wherein the phase-adjusting circuit comprises an LC circuit.

3. The plasma CVD system according to claim 1, wherein the plasma-producing high-frequency electrode is provided with an auxiliary matching circuit on the power supply side of the electrode and the high-frequency power branches through the auxiliary matching circuit from the high-frequency power source provided in a smaller number than the number of the plasma-producing high-frequency electrode, to control the high-frequency power supplied to each high-frequency electrode.

4. The plasma CVD system according to claim 3, wherein the auxiliary matching circuit comprises an LC circuit.

5. The plasma CVD system according to claim 1, wherein the high-frequency power has an oscillation frequency in the range of from 60 MHz to 300 MHz.

6. The plasma CVD system according to claim 1, wherein a dielectric member is provided between the plasma-producing high-frequency electrode and the space in which the plasma is produced.

7. The plasma CVD system according to claim 1, wherein the high-frequency electrode is provided in plurality and the plurality of high-frequency electrodes are arranged outside the reactor in such a way that the high-frequency electrodes surround the reactor, the reactor being formed of a dielectric member at least in part.

8. The plasma CVD system according to claim 1, wherein the high-frequency electrode is provided in plurality and the plurality of high-frequency electrodes are arranged inside the reactor in such a way that the high-frequency electrodes surround the film-forming substrate disposed therein.

9. The plasma CVD system according to claim 1, wherein the high-frequency electrode is provided in plurality and the plurality of high-frequency electrodes are arranged inside or outside the reactor in such a way that the high-frequency electrodes surround the film-forming substrate disposed therein.

10. The plasma CVD system according to claim 1, which further comprises a rotating mechanism for rotating the film-forming substrate.

11. The plasma CVD system according to claim 1, wherein the substrate comprises a flat-plate substrate, and the high-frequency electrode is provided in plurality so as to be arranged in parallel to the flat-plate substrate disposed.

12. The plasma CVD system according to claim 1, wherein the substrate comprises a continuous sheet-like substrate which is wound off from a holding roll at the time of film formation and is wound up on a wind-up roll after film formation, and the plasma-producing high-frequency electrode is provided in plurality so as to be arranged in parallel to the sheet-like substrate to be fed.

13. The plasma CVD system according to claim 1, wherein the plasma-producing high-frequency electrode has a rod-like or plate-like conductive member.

14. The plasma CVD system according to claim 1, wherein the plasma-producing high-frequency electrode is provided in plurality, and the phase-adjusting circuit is provided to each plasma-producing high-frequency electrode.

15. The plasma CVD system according to claim 1, which further comprises a plasma-producing high-frequency electrode connected directly to a ground.

* * * * *